United States Patent
Rachmady et al.

(10) Patent No.: US 11,296,203 B2
(45) Date of Patent: Apr. 5, 2022

(54) SWITCHING DEVICE HAVING GATE STACK WITH LOW OXIDE GROWTH

(71) Applicant: Intel Corporation, Santa Clara, CA (US)

(72) Inventors: Willy Rachmady, Beaverton, OR (US); Cheng-Ying Huang, Hillsboro, OR (US); Gilbert Dewey, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/649,183

(22) PCT Filed: Dec. 26, 2017

(86) PCT No.: PCT/US2017/068390
§ 371 (c)(1),
(2) Date: Mar. 20, 2020

(87) PCT Pub. No.: WO2020/081040
PCT Pub. Date: Apr. 23, 2020

(65) Prior Publication Data
US 2021/0074828 A1  Mar. 11, 2021

(51) Int. Cl.
*H01L 29/51* (2006.01)
*H01L 21/285* (2006.01)
(Continued)

(52) U.S. Cl.
CPC ...... *H01L 29/513* (2013.01); *H01L 21/28518* (2013.01); *H01L 23/16* (2013.01);
(Continued)

(58) Field of Classification Search
CPC ... H01L 29/513; H01L 29/0847; H01L 29/45; H01L 29/517; H01L 29/665;
(Continued)

(56) References Cited

U.S. PATENT DOCUMENTS 9,620,610 B1\*  4/2017  Jangjian .......... H01L 21/823821
9,818,875 B1   11/2017  Bi et al.
(Continued)

FOREIGN PATENT DOCUMENTS

KR  10-0653711 B1  12/2006

OTHER PUBLICATIONS

International Searching Authority, "Notification of Transmittal of the International Search Report and the Written Opinion of the International Searching Authority," dated Jun. 26, 2020, in International application No. PCT/US2017/068390.
(Continued)

*Primary Examiner* — Christine A Enad
(74) *Attorney, Agent, or Firm* — Trop, Pruner & Hu, P.C.

(57) ABSTRACT

An embodiment includes a system comprising: a switching device that includes a fin; and a source contact on a source, a gate contact on a channel, and a drain contact on a drain; wherein the gate contact includes: (a)(i) a first layer that includes oxygen, the first layer directly contacting the fin, (a)(ii) a second layer that includes a dielectric material, (c) a third layer that includes at least one of aluminum, titanium, ruthenium, zirconium, hafnium, tantalum, niobium, vanadium, thorium, barium, magnesium, cerium, and lanthanum, and (a)(iii) a fourth layer that includes a metal, wherein (b)(i) the source contact, the gate contact, and the drain contact are all on the fin, and (b)(ii) the second layer is between the first and fourth layers. Other embodiments are described herein.

22 Claims, 9 Drawing Sheets

(51) Int. Cl.
  *H01L 23/16* (2006.01)
  *H01L 23/367* (2006.01)
  *H01L 23/00* (2006.01)
  *H01L 27/092* (2006.01)
  *H01L 29/08* (2006.01)
  *H01L 29/45* (2006.01)
  *H01L 29/66* (2006.01)
  *H01L 29/78* (2006.01)

(52) U.S. Cl.
  CPC .......... *H01L 23/367* (2013.01); *H01L 23/562* (2013.01); *H01L 27/0924* (2013.01); *H01L 29/0847* (2013.01); *H01L 29/45* (2013.01); *H01L 29/517* (2013.01); *H01L 29/665* (2013.01); *H01L 29/66636* (2013.01); *H01L 29/66795* (2013.01); *H01L 29/7851* (2013.01)

(58) Field of Classification Search
  CPC ......... H01L 29/66636; H01L 29/66795; H01L 21/28518; H01L 23/16; H01L 23/367; H01L 23/562
  See application file for complete search history.

(56) References Cited

U.S. PATENT DOCUMENTS

| | | |
|---|---|---|
| 2006/0151845 A1 | 7/2006 | Govindarajan |
| 2010/0048010 A1 | 2/2010 | Chen et al. |
| 2011/0227163 A1 | 9/2011 | Wang et al. |
| 2011/0254063 A1 | 10/2011 | Chen et al. |
| 2013/0075833 A1 | 3/2013 | Liu et al. |
| 2015/0035039 A1* | 2/2015 | Li .................. H01L 29/785 257/316 |
| 2016/0118261 A1 | 4/2016 | Haukka et al. |
| 2016/0218082 A1* | 7/2016 | Lee .................. H01L 24/19 |
| 2016/0380056 A1 | 12/2016 | Yeo et al. |
| 2017/0162383 A1 | 6/2017 | Li |
| 2017/0207095 A1* | 7/2017 | Lee .................. H01L 29/66795 |
| 2017/0213770 A1 | 7/2017 | JangJian et al. |
| 2019/0122999 A1* | 4/2019 | Hung .................. H01L 21/563 |
| 2019/0131418 A1* | 5/2019 | Ando .................. H01L 29/4966 |

OTHER PUBLICATIONS

Batude et al., "Demonstration of Low Temperature 3D Sequential FDSOI Integration Down to 50 nm Gate Length," 2011 Symposium on VLSI Technology Digest of Technical Papers, pp. 158-159.
"Diffusion Barrier," Wikipedia, downloaded Nov. 29, 2017, two pages.
Hook, "FinFET Isolation Considerations and Ramifications—Bulk vs. SOI," SOI Consortium's Fully-Depleted Tech Workshop, VLSI-TSA, Taiwan, Apr. 2013, eight pages.
"Getter Materials," VAC AERO International, Jun. 5, 2017, three pages.
Ruzyllo, "Guide to Semiconductor Fabrication," Chapter 3.2.1., Gettering, 2007, two pages.
"Making of a Chip" Illustrations, 22nm 3D/Trigate Transistors—Version, Intel Corporation, Jan. 2012, 18 pages.
"MOSFET Short Channel Effects," OnMyPhD, downloaded Nov. 29, 2017, six pages.
Das et al., "Intel's 2-nm Process Gives MOSFET Switch a Facelift," UBM Techinsights, Sep. 6, 2012, four pages.
Gibb, "Samsung's 14 nm LPE FinFET Transistors," EE Times, Jan. 19, 2016, four pages.
Euroepan Patent Office, Office Action dated Jul. 15, 2021 in European Patent Application No. 17936991.3 (7 pages).

* cited by examiner

SWITCHING DEVICE HAVING GATE STACK WITH LOW OXIDE GROWTH

TECHNICAL FIELD

Embodiments of the invention are in the field of semiconductor devices and, in particular, non-planar transistors.

BACKGROUND

A FinFET is a transistor built around a thin strip of semiconductor material (referred to as the "fin"). The transistor includes the standard field effect transistor (FET) nodes/components: a gate, a gate dielectric, a source region, and a drain region. The conductive channel of the device resides on the outer sides of the fin beneath the gate dielectric. Specifically, current runs along both "sidewalls" of the fin as well as along the top side of the fin. Because the conductive channel essentially resides along the three different outer, planar regions of the fin, such a FinFET is typically referred to as a "tri-gate" FinFET. Other types of FinFETs exist (such as "double-gate" FinFETs in which the conductive channel principally resides only along both sidewalls of the fin and not along the top side of the fin).

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Figure 1:
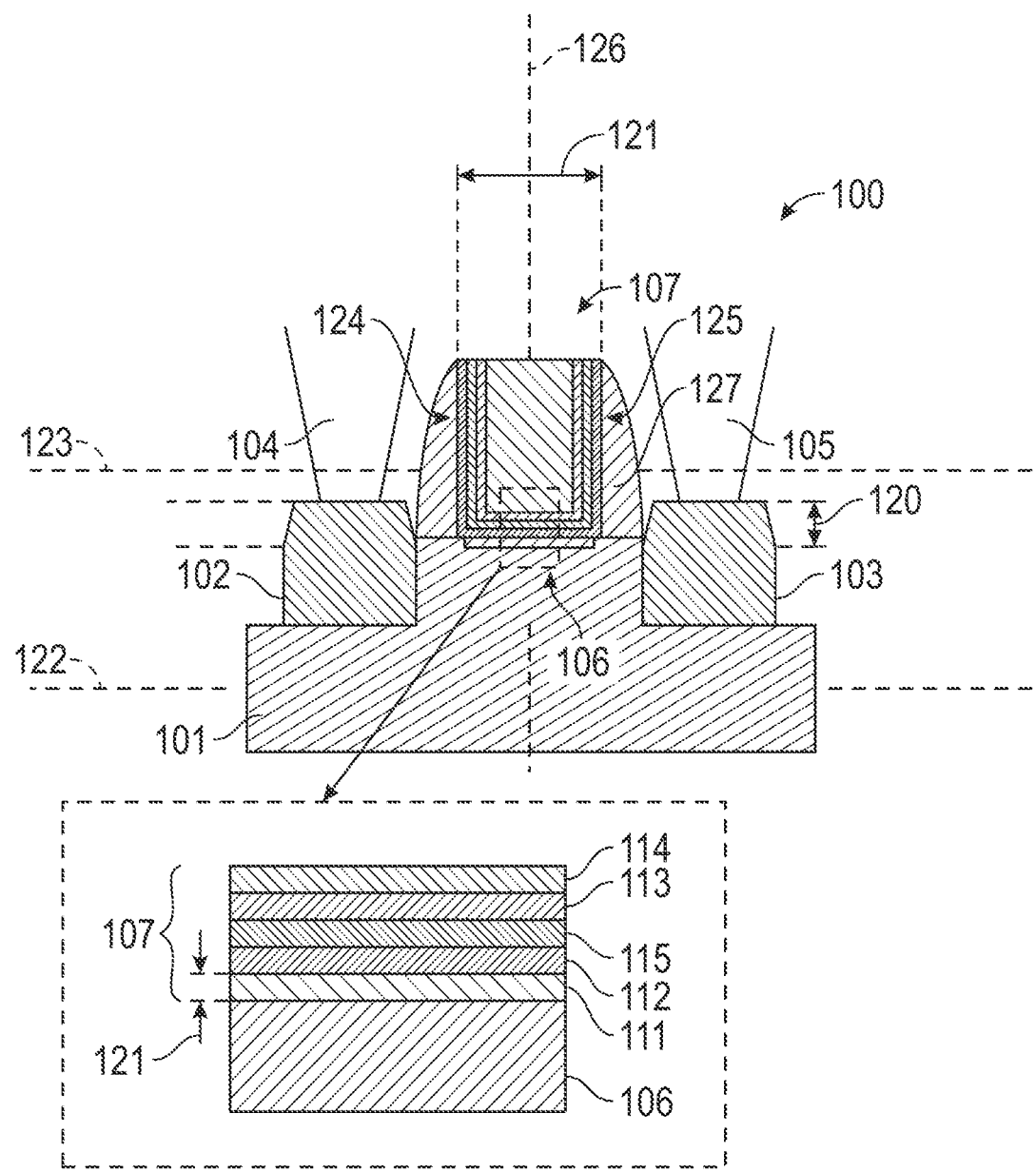
FIG. 1 includes an embodiment of a metal gate stack.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer (e.g., barrier layer, seed layer, etch stop layer) of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

A "gate last" or "replacement metal gate" process for a FinFET may include the following steps: (1) form fin, (2) form a gate dielectric, (3) form polysilicon gate electrode ("dummy gate") on the gate dielectric, (4) form doped source and drain nodes, (5) replace the dummy gate with a metal gate.

However, with scaling of FinFETs Applicant has determined issues exist with this "gate last" approach. For example, doping of the source and drain nodes is difficult to control. The doping sometimes extends beyond the source and drain nodes and into the channel region. This in turn leads to "short channel" effects which are based on: (1) drain-induced barrier lowering (DIBL), (2) surface scattering, (3) velocity saturation, (4) impact ionization, and/or (5) hot carrier injection (HCl).

To counter the above mentioned doping-related issues, Applicant instead began forming FinFETs as follows: (1) form fin, (2) form gate dielectric on fin and anneal gate dielectric, (3) form metal gate contact on the gate dielectric, (4) form trenches in dielectric adjacent gate contact, (5) form epitaxial growth of source and drain materials in trenches, (6) form salicide layers over source and drains, and (7) form source and drain contacts over salicide layers.

Not every step of the above processes has been addressed to maintain focus on the issue that in the first process the metal gate is formed last and in the second process the epitaxial source and drain nodes were formed after the gate. While this helps reduce the amount of doping that may extend into the channel, Applicant determined other issues arise.

Applicant determined that first, when the source and drain materials are annealed the metal gate is already present. The high temperatures due to the anneal cause oxygen to diffuse from the metal gate contact into a gate oxide layer (e.g., $SiO_2$ interfacial layer that interfaces the fin) that exists between the fin and the gate dielectric. This oxygen causes the gate oxide layer to thicken, which affects threshold voltage for the device and otherwise contributes to short channel effects (e.g., increase in surface scattering). Applicant further determined that second, the heat used to form any salicide layers also causes oxygen to diffuse from the metal gate contact into the gate oxide layer. Again, this oxygen causes the gate oxide layer to thicken, which affects threshold voltage for the device and otherwise contributes to short channel effects (e.g., increase in surface scattering).

However, embodiments described herein include a gettering layer within the metal stack. Therefore, any post gate processing at high temperature (e.g., epitaxial growth of source and drain and/or salicide layer formation) will have limited effect because oxygen migrating from the metal gate (or elsewhere in the surroundings of the gate) will diffuse into the gettering layer instead of the interfacial oxide layer, and therefore any oxygen induced growth of the interfacial layer will be limited.

The ability to perform post gate processing at higher temperatures has further advantages. For example, to form three dimensional stacked transistors a process includes forming a device layer with transistors and then transferring another layer (donor layer), such as a blank wafer, onto the already existing device layer (receiving layer). The donor layer is then processed to form devices that include metal gates. However, when performing steps such as annealing a gate dielectric for the metal gates of the donor layer the already formed metal gates of the receiving layer are exposed to high heat (e.g., above 800 degrees C. for annealing a high K gate dielectric layer). As described above, subjecting a metal gate to high heat can cause oxygen diffusion and gate oxide thickening. However, if the receiver layer's metal gate stacks include the aforementioned gettering layer those metal gate stacks can now better endure the high heat phases associated with device formation on the donor layer.

FIG. 1 includes an embodiment. Switching device 100 includes a fin 101, a source contact 104 on a source 102, a gate contact 107 on a channel 106, and a drain contact 105 on a drain 103. The gate contact 107 includes a first layer 111 that includes oxygen, the first layer directly contacting the fin. Layer 111 is an interfacial oxide layer that forms on the fin. Gate contact 107 includes a second layer 112 that includes a dielectric material. Layer 112 is a gate dielectric layer. Gate contact 107 includes a third layer 113 that includes at least one of aluminum, titanium, ruthenium, zirconium, hafnium, tantalum, niobium, vanadium, thorium, barium, magnesium, cerium, and lanthanum. Layer 113 is a gettering layer. Gate contact 107 includes a fourth layer 114 that includes a metal. Layer 114 includes a metal gate. The source contact 104, the gate contact 107, and the drain contact 105 are all on the fin. The second layer 112 is between the first and fourth layers 111, 114.

Layer 114 includes a workfunction metal which includes, for example, titanium and nitrogen. Layer 113 is a gettering layer to couple to oxygen that diffuses from layer 114 during elevated heating of layer 114.

As used herein "gettering" means enforcing motion of contaminants (e.g., oxygen) away from a layer (e.g., the metal gate contact layer) into another layer and trapping them there (e.g., via covalent or ionic bonding). A getter is a reactive material that is deliberately placed inside a system for the purpose of scavenging unwanted contaminates. Essentially, when contaminates contact the getter material, the contaminants combine with the getter material chemically or by adsorption so as to be removed from the environment.

In an embodiment layer 113 is between layers 112 and 114. In an embodiment layer 113 directly contacts layer 114. In this arrangement the gettering layer is positioned immediately adjacent the oxygen source, which is the metal layer 114.

An embodiment includes a fifth layer 115. Layer 115 comprises at least one of cobalt, ruthenium, tantalum, nitrogen, oxygen, indium, tungsten, and titanium. For example, layer 115 is a barrier layer to limit diffusion of elements between layers 112 and 113.

There are various embodiments where the materials used in the gate stack may vary according to design requirements of any given circuit. One possible embodiment provides: (1) layer 111 includes silicon (e.g., silicon oxide, SiON, but in other embodiments may include $Al_2O_3$, $La_2O_3$, or some other dielectric layer); (2) layer 112 includes hafnium (e.g., hafnium oxide); (3) layer 113 includes at least one of titanium, aluminum, and ruthenium (e.g., TiAl); (4) layer 114 includes titanium (e.g., titanium nitride); and (5) layer 115 includes tantalum (e.g., tantalum nitride).

In an embodiment the switching device comprises a P-type metal-oxide-semiconductor (PMOS) device. For example, node 102 may include silicon germanium grown epitaxially on fin 101 where fin 101 includes silicon. Node 102 may be doped with boron. Also, node 103 may include silicon germanium grown epitaxially on fin 101. Node 103 may be doped with boron. As shown in FIG. 1, nodes 102, 103 may extend above the channel by height 120. Nodes 102, 103 may have been grown in a trench after layers 112 and/or 114 were already formed. As mentioned above, any anneal or other high temperature treatment of nodes 102, 103 would not necessarily result in thickened layer 111 because layer 113 would getter oxygen from layer 114.

In an embodiment the gate has a width 121 of less than or equal to 25 nm. This level of scaling may lead to short channel effects. Thus, width 121 being so short is a critical value in that it causes short channel effects that are remedied by gettering layer 113. Due to gettering layer 113, layer 111 has a thickness 121, measured orthogonal to the width of the gate, of no more than 2 nm.

In an embodiment the fin 101 includes a long axis 122 orthogonal to a height of the fin. An additional axis 123, parallel to the long axis 122, intersects first and second portions 124, 125 of the third layer 113; and the fourth layer 114 is between the first and second portions of the third layer. The axis 123 does not intersect the first layer. In an embodiment another axis 126, orthogonal to the axis 123, intersects the first 111, second 112, and third layers 113. For example, see the "U" shaped layers of gate 107 regarding axes 123 and 126.

In an embodiment the first layer 111 directly contacts the second layer 112. In many embodiments layer 111 directly contacts layer 112 and layer 113 directly contacts layer 114. However, in those particular embodiments the arrangement of other layers (e.g., barrier layers and gate dielectric) may be arranged in various ways and other layers may be included between layers 111 and 114.

Figure 2:
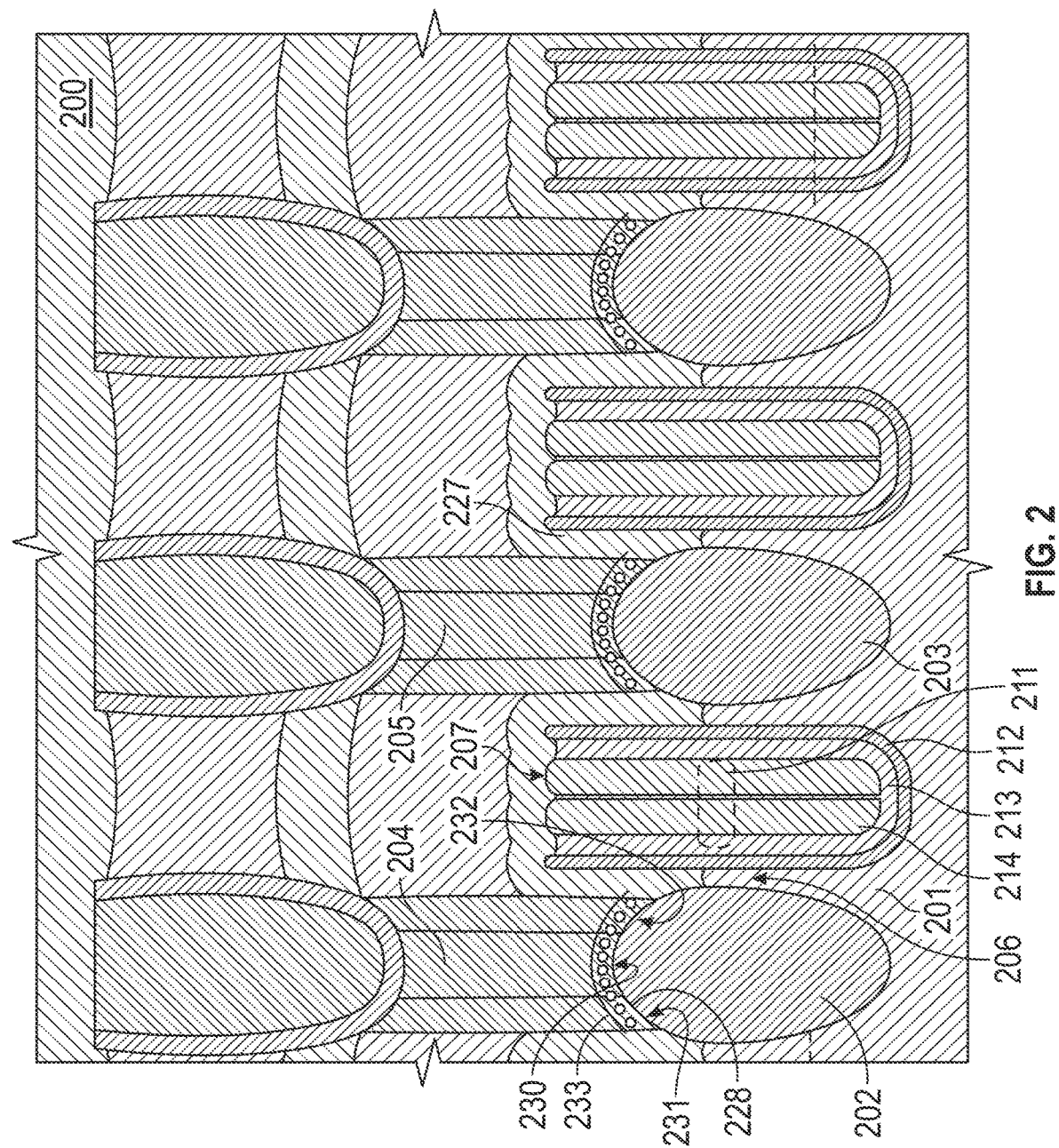
FIG. 2 includes an embodiment of a metal gate stack.

FIG. 2 includes a more "real world" depiction of an embodiment 200 taken from the same perspective as FIG. 1.

Source node 202 couples to source contact 204 and drain node 203 couples to drain contact 205. Gate 207 includes a high K dielectric layer 212, a gettering layer 213, and a workfunction metal 214. Gate 207 is over interfacial oxide 211 and channel 206. Gate 207 is adjacent spacer (e.g., a nitride) 227 (see also 127 in FIG. 1).

In an embodiment the source contact 204 includes a bottom surface 228 that is between the source contact and the source 202. In FIG. 2 the source and drain nodes 202, 203 were epitaxially grown (within a trench to limit doping from entering channel 206) and are raised above channel 206. The bottom surface 228 of contact 204 includes a middle portion 230 and two lateral edges 231, 232. The two lateral edges are closer to the fin 201 than the middle portion. For example, surface 228 is concave in that it narrows as it moves upward and away from the fin. This is indicative of a process whereby the source and drain are not etched in order to form the source and drain contacts. Instead, the source and drain are grown in trenches after the formation of layers 211 and 214. During the high temperature processing of the epitaxial source and drain gettering layer 213 prevents or limits oxygen migration from layer 214 to layer 211.

In an embodiment a salicide layer 233 exists between the source contact 204 and the source 202 (and/or between drain contact and drain). The formation of a salicide is a high temperature process. Since source 202 was grown after layers 211, 214 were formed, salicide 233 is also formed after the formation of source 202. During the high temperature processing of the salicide layer gettering layer 213 prevents or limits oxygen migration from layer 214 to layer 211.

As used herein a "salicide" is a self-aligned silicide process. This is a process in which silicide contacts are formed only in those areas in which deposited metal (which after annealing becomes a metal component of the silicide) is in direct contact with silicon, hence, are self-aligned. Thus, if source 202 includes silicon germanium then the silicon portion of that source could be formed into a salicide. More generally, layer 233 is a silicide (alloy of silicon and metal).

Figure 3:
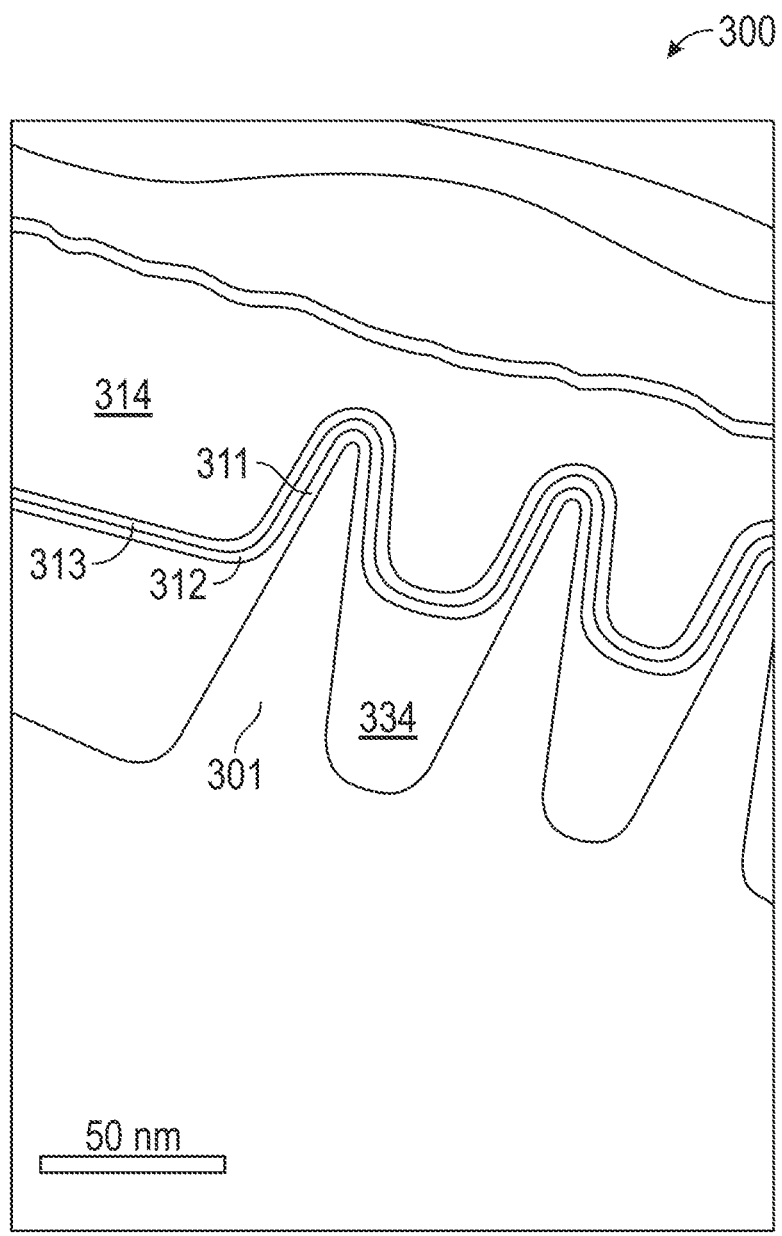
FIG. 3 includes an embodiment of a metal gate stack.

FIG. 3 includes an embodiment with a cross-section of a fin taken along the short axis of the fin. Fin 301 is separated from other fins by dielectric 334. Fin 301 couples to a gate stack with interfacial oxide layer 311, high K gate dielectric layer 312, gettering layer 313, and metal layer 314.

Figure 4:
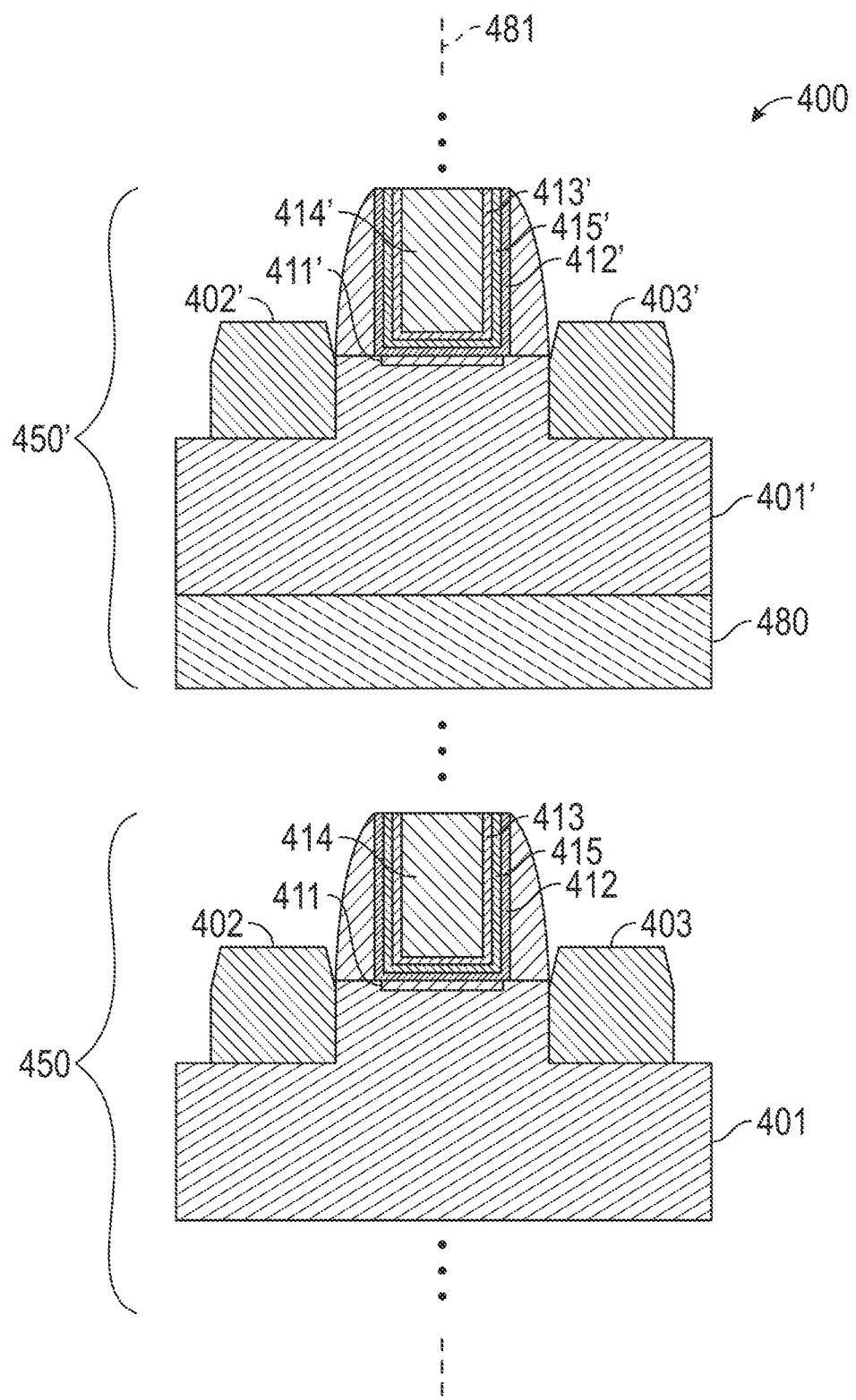
FIG. 4 includes an embodiment of metal gate stacks formed using a layer transfer process.

FIG. 4 depicts a system resulting from layer transfer. Layer transfer is described above and in, for example, U.S. Patent Application Publication Number 2016/0233206, which is assigned to Intel Corp. of Santa Clara, Calif., USA. System 400 includes receiving portion 450 and donor portion 450'. Each includes a metal gate stack as described for FIG. 1 (however in other embodiments one of the donor or receiver may include a different metal gate stack for a NMOS device or otherwise). For instance, in portion 450 source and drains 402, 403 are on fin 401. Gate stack includes interfacial oxide 411, high K gate dielectric 412, barrier layer 415, gettering layer 413, and metal 414. In an embodiment this gate stack is formed before any donor wafer if transferred to portion 450.

A wafer is then transferred to portion 450. That wafer includes what will eventually be formed into fin 401'. The donor wafer bonds to portion 450 using layer 480. Layer 480 may include a dielectric or adhesive. In the instance of a dielectric, layer 480 is amorphous in contrast to the crystalline nature of fin 401'. The amorphous layer 480 being between crystal portions 401, 401' is indicative of a layer transfer process.

After the layer transfer the upper portion 450' is formed with source and drains 402', 403' on fin 401'. The gate stack includes interfacial oxide 411', high K gate dielectric 412', barrier layer 415', gettering layer 413', and metal 414'. The dots on FIG. 4 show there may be other layers present but not explicitly described herein to maintain focus on the layer transfer aspects of the embodiment of FIG. 4.

Axis 481 intersects the switching devices of portions 450, 450'. In an embodiment (not necessarily shown in FIG. 4) one of the devices is a PMOS device and the other is an NMOS device and they collectively form a CMOS pair.

In an embodiment, the device of portion 450' may not include a gettering layer if the gate will not be subject to heat that would cause its layer 411' to increase beyond an acceptable level. For example, the gate stack of portion 450' may be formed using a gate last approach whereby the source and drain have already been formed before the gate is formed. Thus, a gettering layer is included in portion 450 but not portion 450' in an embodiment.

Figure 5:
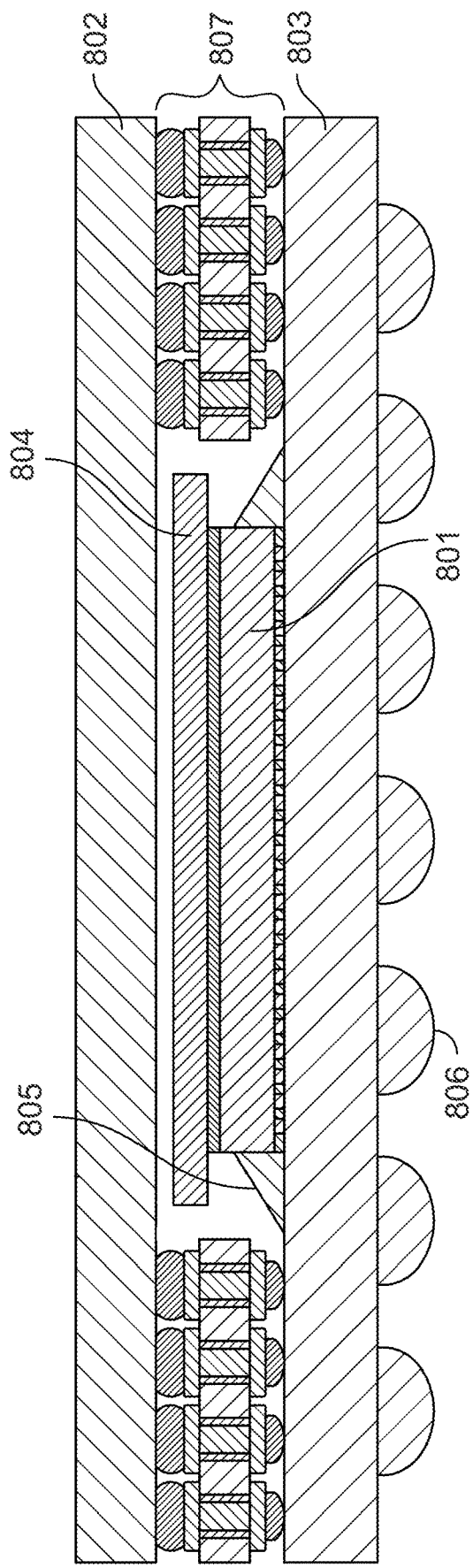
FIG. 5 includes a package in an embodiment.

FIG. 5 includes a package system in an embodiment. The system includes a processor die 801 (a first package) on a package substrate 803. A memory die (a second package) 802 couples to the substrate 803 by way of interposer system 807. Underfill material 805 exists between die 801 and substrate 803. Substrate 803 may include controlled collapse chip connection (C4) interconnects 806. Further, to prevent warping of die 801, die 801 may couple to a metal stiffener 804. Die 801 (and/or die 802) may include a die stack (e.g., multiple dies which may have the same function or differing functions) that may be molded as one unit that functions as a single die. For example, one die of the stack may have a first logic function while another die of the stack has another logic function that differs from the first logic function.

Die 801 includes a device such as the device of FIG. 1, 2, 3, or 4. In another embodiment die 802 includes a device such as the device of FIG. 1, 2, 3 or 4. In an embodiment die 801 includes a device such as the device of FIG. 1, 2, 3 or 4 and die 802 includes a device such as the device of FIG. 1, 2, 3 or 4.

In an embodiment element 804 is not a stiffener but instead is a heat spreader (or is both a stiffener and a heat spreader). A heat spreader is a heat exchanger that moves heat between a heat source and a secondary heat exchanger whose surface area and geometry are more favorable than the source. Such a spreader may be a plate made of copper, which has a high thermal conductivity. By definition, heat is "spread out" over this geometry, so that the secondary heat exchanger may be more fully utilized. This has the potential to increase the heat capacity of the total assembly.

Figure 9:
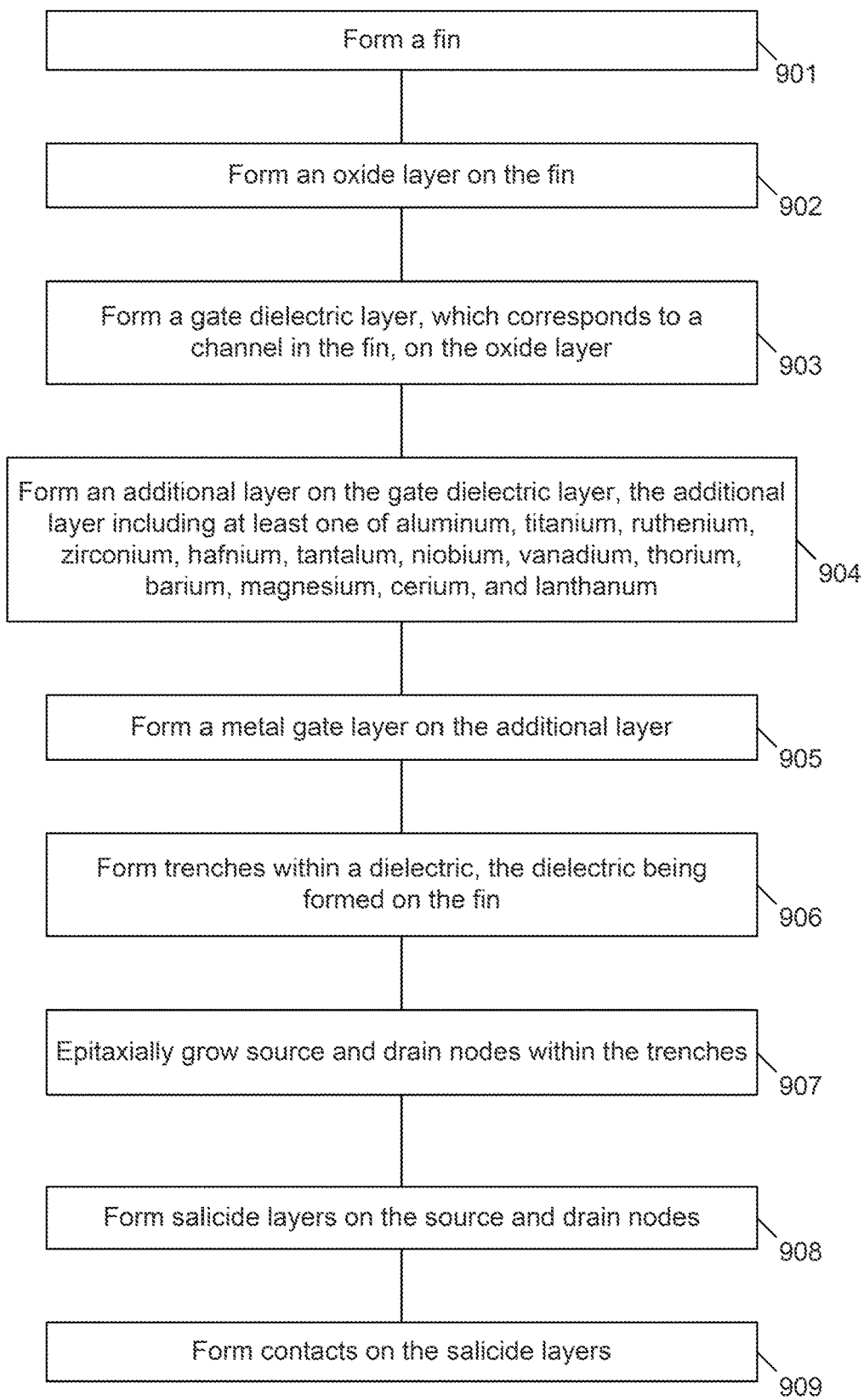
FIG. 9 includes a method in an embodiment.

An embodiment includes a method 900 (FIG. 9) comprising forming a fin (block 901), forming an oxide layer on the fin (block 902), forming a gate dielectric layer, which corresponds to a channel in the fin, on the oxide layer (block 903), forming an additional layer on the gate dielectric layer, the additional layer including at least one of aluminum, titanium, ruthenium, zirconium, hafnium, tantalum, niobium, vanadium, thorium, barium, magnesium, cerium, and lanthanum (block 904), forming a metal gate layer on the additional layer (block 905), forming trenches within a dielectric, the dielectric being formed on the fin (block 906), epitaxially growing source and drain nodes within the trenches (block 907), forming salicide layers on the source and drain nodes (block 908), and forming contacts on the salicide layers (block 909). In some embodiments the forming of salicide layers is optional. In some embodiments, the forming of source and drain nodes and/or the forming of salicide layers includes subjecting the gate stack to temperatures of 700 degrees C. or higher. However, the gettering layer of block 904 will limit heat induced growth of the oxide of block 902.

Figure 6:
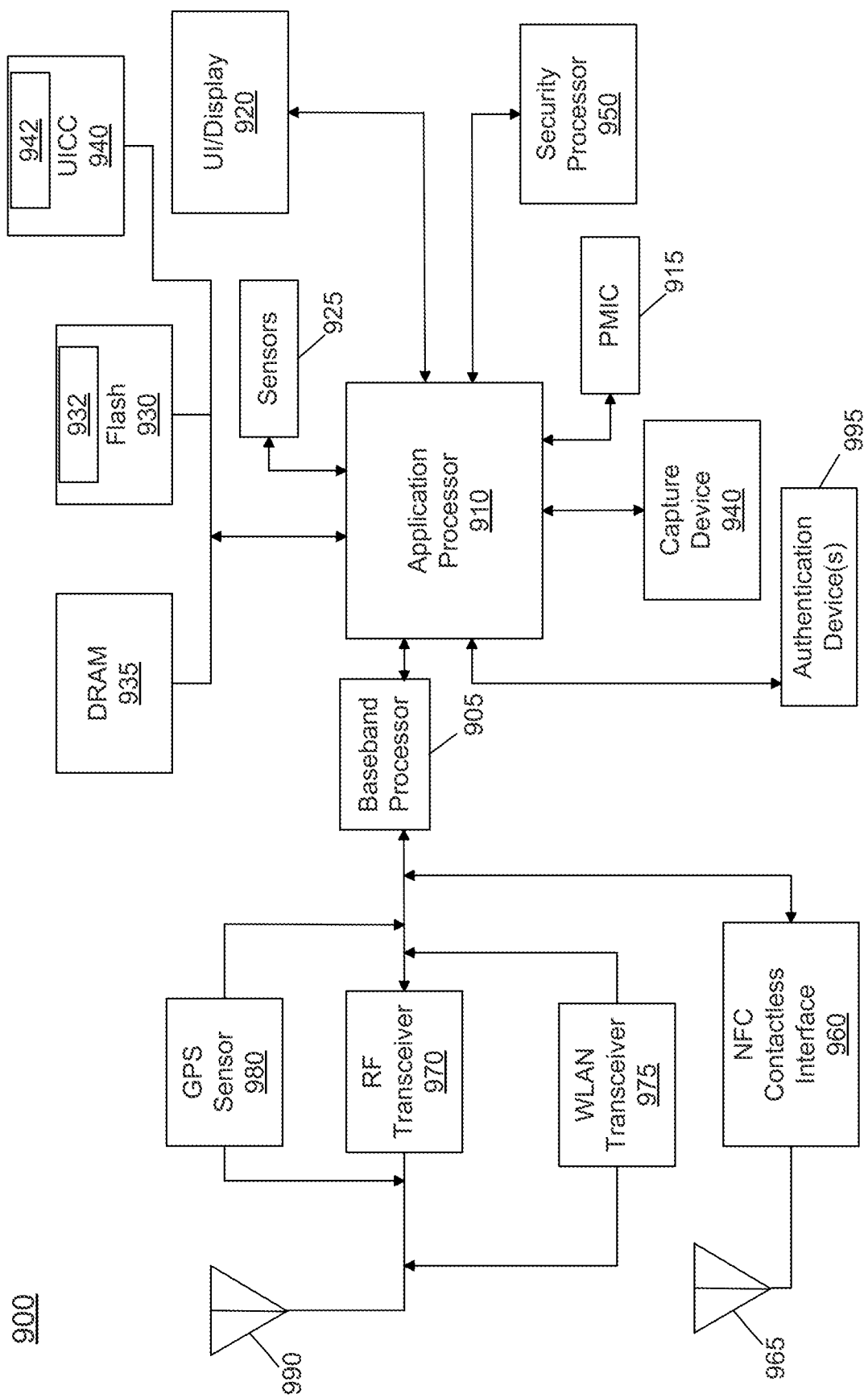
FIGS. 6, 7, 8 include systems that include embodiments.

Referring now to FIG. 6, shown is a block diagram of an example system with which embodiments can be used. As seen, system 900 may be a smartphone or other wireless communicator or any other Internet of Things (IoT) device. A baseband processor 905 (which may be included in a package such as the package of FIG. 5 and/or may include devices such as the device of FIG. 1, 2, 3, or 4) is configured to perform various signal processing with regard to communication signals to be transmitted from or received by the system. In turn, baseband processor 905 is coupled to an application processor 910 (which may be included in a package such as the package of FIG. 5 and/or may include devices such as the device of FIG. 1, 2, 3, or 4), which may be a main CPU of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display). In addition, application processor 910 may couple to a memory system including a non-volatile memory, namely a flash memory 930 (which may be included in a package such as the package of FIG. 5 and/or may include devices such as the device of FIG. 1, 2, 3, or 4) and a system memory, namely a DRAM 935 (which may be included in a package such as the package of FIG. 5 and/or may include devices such as the device of FIG. 1, 2, 3, or 4). In some embodiments, flash memory 930 may include a secure portion 932 in which secrets and other sensitive information may be stored. As further seen, application processor 910 also couples to a capture device 945 such as one or more image capture devices that can record video and/or still images.

A universal integrated circuit card (UICC) 940 comprises a subscriber identity module, which in some embodiments includes a secure storage 942 to store secure user information. System 900 may further include a security processor 950 (e.g., Trusted Platform Module (TPM)) (which may be included in a package such as the package of FIG. 5 and/or may include devices such as the device of FIG. 1, 2, 3 or 4) that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 (which may be included in a package such as the package of FIG. 5 and/or may include devices such as the device of FIG. 1, 2, 3 or 4) couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitry may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 7:
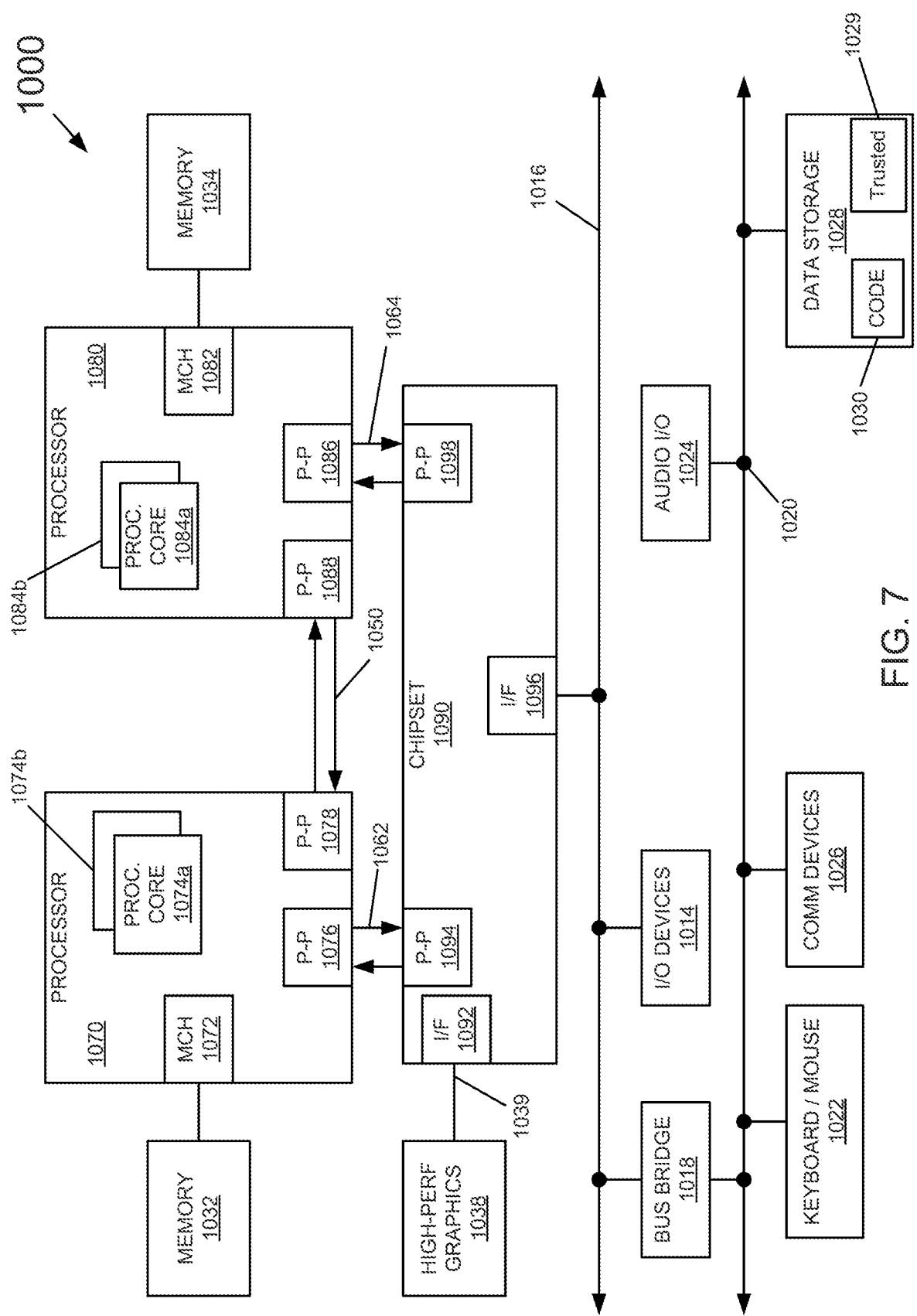

Referring now to FIG. 7, shown is a block diagram of a system in accordance with another embodiment of the present invention. Multiprocessor system 1000 is a point-to-point interconnect system such as a server system, and includes a first processor 1070 (which may be included in a package such as the package of FIG. 5 and/or may include devices such as the device of FIG. 1, 2, 3 or 4) and a second processor 1080 (which may be included in a package such as the package of FIG. 5 and/or may include devices such as the device of FIG. 1, 2, 3 or 4) coupled via a point-to-point interconnect 1050. Each of processors 1070 and 1080 may be multicore processors such as SoCs, including first and second processor cores (i.e., processor cores 1074a and 1074b and processor cores 1084a and 1084b), although potentially many more cores may be present in the processors. In addition, processors 1070 and 1080 each may include a secure engine 1075 and 1085 to perform security operations such as attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors. First processor 1070 and second processor 1080 may be coupled to a chipset 1090 (which may be included in a package such as the package of FIG. 5 and/or may include devices such as the device of FIG. 1, 2, 3 or 4) via P-P interconnects 1052 and 1054, respectively. Chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a non-volatile storage or other mass storage device. As seen, data storage unit 1028 (which may be included in a package such as the package of FIG. 5 and/or may include devices such as the device of FIG. 1, 2, 3 or 4) may include code 1030, in one embodiment. As further seen, data storage unit 1028 also includes a trusted storage 1029 to store sensitive information to be protected. Further, an audio I/O 1024 may be coupled to second bus 1020.

Figure 8:
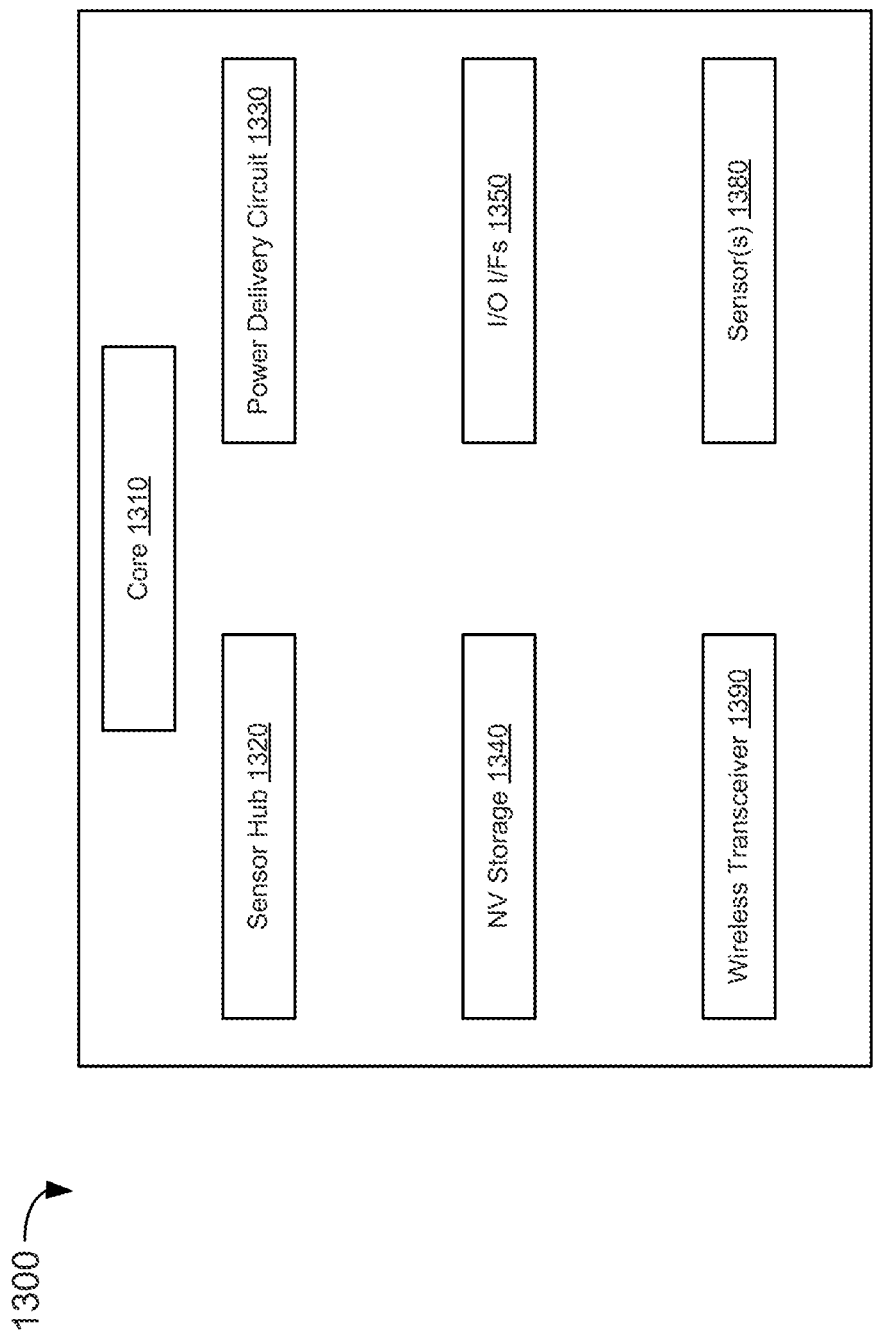

Embodiments may be used in environments where IoT devices may include wearable devices or other small form factor Internet of Things (IoT) devices. Referring now to FIG. 8, shown is a block diagram of a wearable module 1300 in accordance with another embodiment. In one particular implementation, module 1300 (which may be included in a package such as the package of FIG. 5 and/or may include devices such as the device of FIG. 1, 2, 3 or 4) may be an Intel® Curie™ module that includes multiple components adapted within a single small module that can be implemented as all or part of a wearable device. As seen, module 1300 includes a core 1310 (of course in other embodiments more than one core may be present). Such core may be a relatively low complexity in-order core, such as based on an Intel Architecture® Quark™ design. In some embodiments, core 1310 may implement a Trusted Execution Environment (TEE). Core 1310 couples to various components including a sensor hub 1320, which may be configured to interact with a plurality of sensors 1380, such as one or more biometric, motion environmental or other sensors. A power delivery circuit 1330 is present, along with a non-volatile storage 1340. In an embodiment, this circuit may include a rechargeable battery and a recharging circuit, which may in one embodiment receive charging power wirelessly. One or more input/output (TO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

Various embodiments include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes a system comprising: a switching device that includes a fin; and a source contact on a source, a gate contact on a channel, and a drain contact on a drain; wherein the gate contact includes: (a)(i) a first layer that includes oxygen, the first layer directly contacting the fin, (a)(ii) a second layer that includes a dielectric material, (c) a third layer that includes at least one of aluminum, titanium, ruthenium, zirconium, hafnium, tantalum, niobium, vanadium, thorium, barium, magnesium, cerium, and lanthanum, and (a)(iii) a fourth layer that includes a metal; wherein (b)(i) the source contact, the gate contact, and the drain contact are all on the fin, and (b)(ii) the second layer is between the first and fourth layers.

Example 2 includes the system of example 1 wherein the third layer is between the second and fourth layers.

Example 3 includes the system of example 2 wherein the third layer directly contacts the fourth layer.

Example 4 includes the system of example 3 comprising a fifth layer, the fifth layer comprising at least one of cobalt, ruthenium, tantalum, nitrogen, oxygen, indium, tungsten, and titanium.

Example 5 includes the system of example 4 wherein the fifth layer is between the second and third layers.

Example 6 includes the system of example 5 wherein: the first layer includes silicon; the second layer includes hafnium; the third layer includes at least one of titanium, aluminum, and ruthenium; the fourth layer includes titanium; and the fifth layer includes tantalum.

Example 7 includes the system of example 3 wherein the switching device comprises a P-type metal-oxide-semiconductor (PMOS) device.

Example 8 includes the system of example 3 wherein the gate has a width of less than 25 nm and the first layer has a thickness, measured orthogonal to the width of the gate, of no more than 2 nm.

However, in other embodiments the first layer has a thickness, measured orthogonal to the width of the gate, of no more than 1, 3, 4, 5, or 6 nm. In other embodiments the gate has a width of less than 30, 28, 26, 24, 22, 20, 18, or 16 nm.

Example 9 includes the system of example 3 wherein: the fin includes a long axis orthogonal to a height of the fin; an additional axis, parallel to the long axis, intersects first and second portions of the third layer; and the fourth layer is between the first and second portions of the third layer.

Example 10 includes the system of example 9 wherein the additional axis does not intersect the first layer.

Example 11 includes the system of example 10 wherein another axis, orthogonal to the additional axis, intersects the first, second, and third layers.

Example 12 includes the system of example 3 wherein the first layer directly contacts the second layer.

Example 13 includes the system of example 3 comprising: an additional switching device that includes an additional fin; and an additional source contact on an additional source, an additional gate contact on an additional channel, and an additional drain contact on an additional drain; wherein the additional gate contact includes: (a)(i) an additional first layer that includes oxygen, the additional first layer directly contacting the additional fin, (a)(ii) an additional second layer that includes an additional dielectric material; and (a)(iii) an additional switching device layer that includes a metal, wherein (b)(i) the additional source contact, the additional gate contact, and the additional drain contact are all on the additional fin, and (b)(ii) the additional second layer is between the additional first and the additional switching device layers.

Example 14 includes the system of example 13 wherein: the additional switching device includes an additional third layer that includes at least one of aluminum, titanium, ruthenium, zirconium, hafnium, tantalum, niobium, vanadium, thorium, barium, magnesium, cerium, and lanthanum: the additional switching device layer directly contacts the additional third layer.

Example 15 includes the system of example 13 comprising a fifth layer that includes at least one of a dielectric material and a bonding material, wherein: the fifth layer includes a material that is amorphous, the fifth layer is between the switching device and the additional switching device.

Example 16 includes the system of example 15 wherein: the fin includes a long axis orthogonal to a height of the fin; an additional axis, orthogonal to the long axis, intersects the switching device and the additional switching device.

Example 17 includes the system of example 16 wherein: the switching device is a P-type metal-oxide-semiconductor (PMOS) device and an N-type MOS (NMOS) device; the additional switching device is another of a PMOS device and an NMOS device; collectively the switching device and the additional switching device comprise a complementary MOS (CMOS) system.

Example 18 includes the system of example 3 wherein: the source contact includes a bottom surface that is between the source contact and the source; the bottom surface includes a middle portion and two lateral edges; the two lateral edges are closer to the fin than the middle portion.

Example 19 includes the system of example 18 comprising a salicide layer between the source contact and the source.

Example 20 includes the system of example 3 comprising a salicide layer between the source contact and the source.

Example 21 includes a system comprising: a memory; and a processor coupled to the memory, wherein at least one of the processor and the memory include the switching device according to any one of examples 1 to 20.

Example 22 includes a package comprising: a package substrate; a first die on the package substrate; a second die on the package substrate; wherein the first die includes: source, drain, and gate contacts on a fin; wherein the gate contact includes: (a)(i) a first layer, which includes oxygen, directly contacting the fin, (a)(ii) a second layer that includes a gate dielectric, (c) a third layer that includes at least one of aluminum, titanium, ruthenium, zirconium, hafnium, tantalum, niobium, vanadium, thorium, barium, magnesium, cerium, and lanthanum, and (a)(iii) a fourth layer that includes a metal.

Example 23 includes the package of example 22 comprising at least one of (a) a stiffener coupled to the first die, and (b) a heat spreader coupled to the first die.

Example 24 includes the package of example 23 wherein: the source contact includes a lower surface between the source contact and a source node; the source node is on the fin and is not monolithic with the fin; the lower surface includes a recess with a first width and a second width that is wider than the first width; the first width is between the source contact and the second width.

Example 25 includes the package of example 23, the first die comprising: an additional transistor; a fifth layer between the transistor and the additional transistor, the fifth layer including an amorphous material; the fin includes a long axis and another axis, orthogonal to the long axis, intersects the first and second transistors.

Example A1. A system comprising: a switching device that includes a fin; and a source contact on a source, a gate contact on a channel, and a drain contact on a drain; wherein the gate contact includes: (a)(i) a first layer that includes oxygen, the first layer directly contacting the fin, (a)(ii) a second layer that includes a dielectric material, (c) a third layer that includes at least one of aluminum, titanium, ruthenium, zirconium, hafnium, tantalum, niobium, vanadium, thorium, barium, magnesium, cerium, and lanthanum, and (a)(iii) a fourth layer that includes a metal, wherein (b)(i) the source contact, the gate contact, and the drain contact are all on the fin, and (b)(ii) the second layer is between the first and fourth layers.

Example A2. The system of example A1 wherein the third layer is between the second and fourth layers.

Example A3. The system according to any of examples A1-2 wherein the third layer directly contacts the fourth layer.

Example A4. The system according to any of examples A1-3 comprising a fifth layer, the fifth layer comprising at least one of cobalt, ruthenium, tantalum, nitrogen, oxygen, indium, tungsten, and titanium.

Example A5. The system of example A4 wherein the fifth layer is between the second and third layers.

Example A6. The system according to any of examples A4-5 wherein: the first layer includes silicon; the second layer includes hafnium; the third layer includes at least one of titanium, aluminum, and ruthenium; the fourth layer includes titanium; and the fifth layer includes tantalum.

Example A7. The system according to any of examples A1-6 wherein the switching device comprises a P-type metal-oxide-semiconductor (PMOS) device.

Example A8. The system according to any of examples A1-7 wherein the gate has a width of less than 25 nm and the first layer has a thickness, measured orthogonal to the width of the gate, of no more than 2 nm.

Example A9. The system according to any of examples A1-8 wherein: the fin includes a long axis orthogonal to a height of the fin; an additional axis, parallel to the long axis, intersects first and second portions of the third layer; and the fourth layer is between the first and second portions of the third layer.

Example A10. The system of example A9 wherein the additional axis does not intersect the first layer.

Example A11. The system of example A10 wherein another axis, orthogonal to the additional axis, intersects the first, second, and third layers.

Example A12. The system according to any of examples A1-11 wherein the first layer directly contacts the second layer.

Example A13. The system according to any of examples A1-12 comprising: an additional switching device that includes an additional fin; and an additional source contact on an additional source, an additional gate contact on an additional channel, and an additional drain contact on an additional drain; wherein the additional gate contact includes: (a)(i) an additional first layer that includes oxygen, the additional first layer directly contacting the additional fin, (a)(ii) an additional second layer that includes an additional dielectric material; and (a)(iii) an additional switching device layer that includes a metal, wherein (b)(i) the additional source contact, the additional gate contact, and the additional drain contact are all on the additional fin, and (b)(ii) the additional second layer is between the additional first and the additional switching device layers.

Example A14. The system of example A13 wherein: the additional switching device includes an additional third layer that includes at least one of aluminum, titanium, ruthenium, zirconium, hafnium, tantalum, niobium, vanadium, thorium, barium, magnesium, cerium, and lanthanum: the additional switching device layer directly contacts the additional third layer.

Example A15. The system according to any of examples A13-14 comprising a fifth layer that includes at least one of a dielectric material and a bonding material, wherein: the fifth layer includes a material that is amorphous, the fifth layer is between the switching device and the additional switching device.

Example A16. The system according to any of examples A13-15 wherein: the fin includes a long axis orthogonal to a height of the fin; an additional axis, orthogonal to the long axis, intersects the switching device and the additional switching device.

Example A17. The system according to any of examples A13-16 wherein: the switching device is one of a P-type metal-oxide-semiconductor (PMOS) device and an N-type MOS (NMOS) device; the additional switching device is another of a PMOS device and an NMOS device; collectively the switching device and the additional switching device comprise a complementary MOS (CMOS) system.

Example A18. The system according to any of examples A1-17 wherein: the source contact includes a bottom surface that is between the source contact and the source; the bottom surface includes a middle portion and two lateral edges; the two lateral edges are closer to the fin than the middle portion.

Example A19. The system of example A18 comprising a salicide layer between the source contact and the source.

Example A20. The system according to any of examples A1-18 comprising a salicide layer between the source contact and the source.

Example A21. A system comprising: a memory; and a processor coupled to the memory, wherein at least one of the processor and the memory include the switching device according to any one of examples A1 to 20.

Example A22. A package comprising: a package substrate; a first die on the package substrate; a second die on the package substrate; wherein the first die includes: source, drain, and gate contacts on a fin; wherein the gate contact includes: (a)(i) a first layer, which includes oxygen, directly contacting the fin, (a)(ii) a second layer that includes a gate dielectric, (c) a third layer that includes at least one of aluminum, titanium, ruthenium, zirconium, hafnium, tantalum, niobium, vanadium, thorium, barium, magnesium, cerium, and lanthanum, and (a)(iii) a fourth layer that includes a metal.

Example A23. The package of example A22 comprising at least one of (a) a stiffener coupled to the first die, and (b) a heat spreader coupled to the first die.

Example A24. The package according to any of examples A22-23 wherein: the source contact includes a lower surface between the source contact and a source node; the source node is on the fin and is not monolithic with the fin; the lower surface includes a recess with a first width and a second width that is wider than the first width; the first width is between the source contact and the second width.

Example A25. The package according to any of examples A22-24, the first die comprising: an additional transistor; a fifth layer between the transistor and the additional transistor, the fifth layer including an amorphous material; the fin includes a long axis and another axis, orthogonal to the long axis, intersects the first and second transistors.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A system comprising:
    a switching device that includes a fin; and
    a source contact on a source, a gate contact on a channel, and a drain contact on a drain;
    an additional switching device that includes an additional fin; and
    an additional source contact on an additional source, an additional gate contact on an additional channel, and an additional drain contact on an additional drain;
    wherein the gate contact includes: (a)(i) a first layer that includes oxygen, the first layer directly contacting the fin, (a)(ii) a second layer that includes a dielectric material, (c) a third layer that includes at least one of aluminum, titanium, ruthenium, zirconium, hafnium, tantalum, niobium, vanadium, thorium, barium, magnesium, cerium, lanthanum, or combinations thereof and (a)(iii) a fourth layer that includes a metal;
    wherein (b)(i) the source contact, the gate contact, and the drain contact are all on the fin, and (b)(ii) the second layer is between the first and fourth layers;
    wherein the additional gate contact includes: (a)(i) an additional first layer that includes oxygen, the additional first layer directly contacting the additional fin, (a)(ii) an additional second layer that includes an additional dielectric material; and (a)(iii) an additional switching device layer that includes a metal;
    wherein (b)(i) the additional source contact, the additional gate contact, and the additional drain contact are all on the additional fin, and (b)(ii) the additional second layer is between the additional first layer and the additional switching device layer;
    wherein (c)(i) the system further comprises a fifth layer that includes at least one of a dielectric material, a bonding material, or combinations thereof, (c)(ii) the fifth layer includes a material that is amorphous, (c)(iii) the fifth layer is between the switching device and the additional switching device; and (c)(iv) one of the switching device and the additional switching device is located entirely above the fifth layer and another of the switching device and the additional switching device is located entirely below the fifth layer.

2. The system of claim 1 wherein the third layer is between the second and fourth layers.

3. The system of claim 2 wherein the third layer directly contacts the fourth layer.

4. The system of claim 3 comprising a sixth layer, the sixth layer comprising at least one of cobalt, ruthenium, tantalum, nitrogen, oxygen, indium, tungsten, titanium, or combinations thereof.

5. The system of claim 4 wherein the sixth layer is between the second and third layers.

6. The system of claim 5 wherein:
    the first layer includes silicon;
    the second layer includes hafnium;
    the third layer includes at least one of titanium, aluminum, ruthenium, or combinations thereof;
    the fourth layer includes titanium; and
    the sixth layer includes tantalum.

7. The system of claim 3 wherein the switching device comprises a P-type metal-oxide-semiconductor (PMOS) device.

8. The system of claim 3 wherein:
    the fin includes a long axis orthogonal to a height of the fin;
    an additional axis, parallel to the long axis, intersects first and second portions of the third layer; and
    the fourth layer is between the first and second portions of the third layer.

9. The system of claim 8 wherein the additional axis does not intersect the first layer.

10. The system of claim 9 wherein another axis, orthogonal to the additional axis, intersects the first, second, and third layers.

11. The system of claim 3 wherein the first layer directly contacts the second layer.

12. The system of claim 3 wherein:
    the source contact includes a bottom surface that is between the source contact and the source;
    the bottom surface includes a middle portion and two lateral edges;
    the two lateral edges are closer to the fin than the middle portion;
    the bottom surface lies within a plane and the plane intersects both the bottom surface and the gate contact.

13. The system of claim 12 comprising a salicide layer between the source contact and the source.

14. The system of claim 3 comprising a salicide layer between the source contact and the source.

15. The system of claim 1 wherein:
the additional switching device includes an additional third layer that includes at least one of aluminum, titanium, ruthenium, zirconium, hafnium, tantalum, niobium, vanadium, thorium, barium, magnesium, cerium, lanthanum, or combinations thereof;
the additional switching device layer directly contacts the additional third layer.

16. The system of claim 1 wherein:
the fin includes a long axis orthogonal to both a height of the fin and a width of the fin;
an additional axis, orthogonal to the long axis, intersects the switching device and the additional switching device.

17. The system of claim 16 wherein:
the switching device is one of a P-type metal-oxide-semiconductor (PMOS) device and an N-type MOS (NMOS) device;
the additional switching device is another of a PMOS device and an NMOS device;
collectively the switching device and the additional switching device comprise a complementary MOS (CMOS) system.

18. A system comprising:
a memory; and
a processor coupled to the memory,
wherein at least one of the processor or the memory includes the switching device according to claim 1.

19. The system of claim 1 wherein the gate contact has a width of less than 25 nm and the first layer has a thickness, measured orthogonal to the width of the gate contact, of no more than 2 nm.

20. A package comprising:
a package substrate;
a first die on the package substrate;
a second die on the package substrate;
wherein the first die includes:
source, drain, and gate contacts on a fin;
wherein the gate contact includes: (a)(i) a first layer, which includes oxygen, directly contacting the fin, (a)(ii) a second layer that includes a gate dielectric, (c) a third layer that includes at least one of aluminum, titanium, ruthenium, zirconium, hafnium, tantalum, niobium, vanadium, thorium, barium, magnesium, cerium, lanthanum, or combinations thereof and (a)(iii) a fourth layer that includes a metal;
wherein the source contact includes a lower surface between the source contact and a source node; the source node is on the fin and is not monolithic with the fin; the lower surface includes a recess with a first width and a second width that is wider than the first width; the first width is between the source contact and the second width;
wherein the lower surface lies within a plane and the plane intersects both the lower surface and the gate contact.

21. The package of claim 20 comprising at least one of (a) a stiffener coupled to the first die, or (b) a heat spreader coupled to the first die.

22. The package of claim 21, the first die comprising a first transistor and the second die including a second transistor;
a fifth layer between the first transistor and the second transistor, the fifth layer including an amorphous material;
the fin includes a long axis and another axis, orthogonal to the long axis, intersects the first and second transistors.

* * * * *